United States Patent
Mizuochi et al.

(10) Patent No.: US 11,335,779 B2
(45) Date of Patent: May 17, 2022

(54) SENSOR ELEMENT, MEASURING DEVICE, METHOD FOR MANUFACTURING SENSOR ELEMENT, ELECTRONIC CIRCUIT ELEMENT, AND QUANTUM INFORMATION ELEMENT

(71) Applicant: KYOTO UNIVERSITY, Kyoto (JP)

(72) Inventors: Norikazu Mizuochi, Kyoto (JP); Hiromitsu Kato, Tsukuba (JP); Toshiharu Makino, Tsukuba (JP); Satoshi Yamasaki, Tsukuba (JP)

(73) Assignee: KYOTO UNIVERSITY, Kyoto (JP)

( * ) Notice: Subject to any disclaimer, the term of this patent is extended or adjusted under 35 U.S.C. 154(b) by 0 days.

(21) Appl. No.: 16/977,342

(22) PCT Filed: Feb. 28, 2019

(86) PCT No.: PCT/JP2019/007808
§ 371 (c)(1),
(2) Date: Sep. 1, 2020

(87) PCT Pub. No.: WO2019/168097
PCT Pub. Date: Sep. 6, 2019

(65) Prior Publication Data
US 2020/0411646 A1 Dec. 31, 2020

(30) Foreign Application Priority Data
Mar. 2, 2018 (JP) .............................. JP2018-037624

(51) Int. Cl.
*H01L 29/16* (2006.01)
*C01B 32/28* (2017.01)
(Continued)

(52) U.S. Cl.
CPC .......... *H01L 29/1602* (2013.01); *C01B 32/26* (2017.08); *C01B 32/28* (2017.08);
(Continued)

(58) Field of Classification Search
CPC .............. H01L 29/1602; H01L 29/167; H01L 21/02527; H01L 21/02576; H01L 21/0262;
(Continued)

(56) References Cited

U.S. PATENT DOCUMENTS 9,249,526 B2   2/2016 Twitchen et al.
9,317,811 B2   4/2016 Scarsbrook et al.
(Continued)

FOREIGN PATENT DOCUMENTS

CN    102076891 A    5/2011
CN    103620093 A    3/2014
(Continued)

OTHER PUBLICATIONS

Ishikawa et al. ("Optical and Spin Coherence Properties of Nitrogen-Vacancy Centers Placed in a 100 nm Thick Isotopically Purified Diamond Layer," Nano Letters, 12, pp. 2083-2087, Mar. 9, 2012) (Year: 2012).*

(Continued)

*Primary Examiner* — Yasser A Abdelaziez
(74) *Attorney, Agent, or Firm* — Kusner & Jaffe (57) ABSTRACT

A sensor element including a diamond in which nitrogen-vacancy centers in a diamond crystal structure stabilize in a negative charge state. By ensuring that the diamond of the sensor element is n-type phosphorus-doped and contains nitrogen-vacancy centers in the crystal structure, the probability that nitrogen-vacancy centers in the diamond lattice are in a neutral state decreases, and the nitrogen-vacancy centers stabilize in a negative charge state.

11 Claims, 4 Drawing Sheets

(51) Int. Cl.
| | |
|---|---|
| *C01B 32/26* | (2017.01) |
| *C23C 16/27* | (2006.01) |
| *C30B 25/02* | (2006.01) |
| *C30B 29/04* | (2006.01) |
| *G01R 33/26* | (2006.01) |
| *H01L 21/02* | (2006.01) |
| *H01L 29/167* | (2006.01) |
| *H01L 39/12* | (2006.01) |

(52) U.S. Cl.
CPC .............. *C23C 16/27* (2013.01); *C30B 25/02* (2013.01); *C30B 29/04* (2013.01); *G01R 33/26* (2013.01); *H01L 21/0262* (2013.01); *H01L 21/02527* (2013.01); *H01L 21/02576* (2013.01); *H01L 29/167* (2013.01); *H01L 39/12* (2013.01); *C01P 2002/52* (2013.01); *C01P 2006/40* (2013.01); *C01P 2006/42* (2013.01)

(58) Field of Classification Search
CPC ......... H01L 39/12; H01L 29/82; C30B 29/04; C30B 25/00; C30B 25/02; C23C 16/27; C01B 32/28; C01B 32/26; G01R 33/26; G01R 33/032; G01R 33/60; C01P 2006/42; C01P 2002/52; C01P 2006/40; C01P 2006/90
See application file for complete search history.

(56) References Cited

U.S. PATENT DOCUMENTS

| | | | |
|---|---|---|---|
| 10,324,142 B2 | 6/2019 | Hatano et al. | |
| 2009/0121614 A1* | 5/2009 | Yamada | H01J 1/304 313/502 |
| 2012/0051996 A1 | 3/2012 | Scarsbrook et al. | |
| 2013/0093424 A1* | 4/2013 | Blank | G01R 33/60 324/318 |
| 2014/0037932 A1 | 2/2014 | Twitchen et al. | |
| 2014/0061510 A1 | 3/2014 | Twitchen et al. | |
| 2016/0334474 A1* | 11/2016 | Hatano | G01R 33/032 |
| 2017/0139017 A1 | 5/2017 | Egan et al. | |
| 2017/0328965 A1 | 11/2017 | Hruby et al. | |
| 2017/0343620 A1 | 11/2017 | Hahn et al. | |

FOREIGN PATENT DOCUMENTS

| | | |
|---|---|---|
| CN | 103890244 A | 6/2014 |
| CN | 106414818 A | 2/2017 |
| JP | 2011529018 | 12/2011 |
| JP | 2012-121748 A | 6/2012 |
| JP | 2012110489 | 6/2012 |
| JP | 2014516905 | 7/2014 |
| JP | 2016023965 | 2/2016 |
| WO | WO2015107907 | 7/2015 |

OTHER PUBLICATIONS

Balasubramanian et al. ("Ultralong spin coherence time in isotopically engineered diamond," Nature materials Letters, vol. 8, pp. 383-387, 2009) (Year: 2009).*
Doi et al. ("Pure negatively charged state of the NV center in n-type diamond," Physical Review B, 93, 081203, 2016) (Year: 2016).*
Balasubramanian et al. ("Ultralong spin coherence time in isotopically engineered diamond," Nature Materials, vol. 8, pp. 383-387, May 2009) (Year: 2009).*
Mizuochi et al. ("Coherence of single spins coupled to a nuclear spin bath of varying density," Physical Review B 80, 041201(R), 2009) (Year: 2009).*
De Oliveira et al. ("Tailoring spin defects in diamond by lattice charging," Nature Communications, May 17, 2017) (Year: 2017).*
Bar-Gill et al. ("Solid-state electronic spin coherence time approaching one second," Nature Communications, Apr. 23, 2013) (Year: 2013).*
International Search Report from corresponding International Patent Application No. PCT/JP19/07808, dated May 14, 2019.
Balasubramanian et al., "Ultralong spin coherence time in isotopically engineered diamond," Nature Materials, vol. 8, pp. 383-387, May 2009 (www.nature.com/naturematerials), published online Apr. 6, 2009.
Office Action issued in corresponding Chinese Patent Application No. 201980015033.4 dated Jan. 19, 2021 (English-language machine translation provided).
P. Jamonneau, et al., Physical Review B 93, 024305 (2016) DOI: <https://doi.org/10.1103/PhysRevB.93.024305>.
N. Bar-Gill, et al. Nature Communications 3, 858 (2012) DOI: <https://doi.org/10.1038/ncomms1856>.

* cited by examiner

Laser sequence

Sequence of irradiation microwave pulses

F I G. 4

SENSOR ELEMENT, MEASURING DEVICE, METHOD FOR MANUFACTURING SENSOR ELEMENT, ELECTRONIC CIRCUIT ELEMENT, AND QUANTUM INFORMATION ELEMENT

FIELD OF THE INVENTION

The present invention relates to a sensor element, and particularly to a sensor element including a diamond. The present invention also relates to a measurement device including the sensor element, a method for manufacturing a sensor element, an electronic circuit element including a diamond, and a quantum information element including a diamond.

BACKGROUND OF THE INVENTION

The crystal structure of diamond may contain composite defects called nitrogen-vacancy centers. The nitrogen-vacancy center is composed of a pair of a nitrogen atom present in place of a carbon atom in a crystal lattice and a vacancy (formed by the loss of the carbon atom) present at a position adjacent to the nitrogen atom, and is also called an NV (Nitrogen-Vacancy) center.

At the NV center, the time until transverse magnetization as a whole disappears with individual electron spins shifting their directions due to precession movement of the individual spins after magnetization of the electron spins aligned in the longitudinal direction of the external magnetic field is inclined in the transverse direction is longer when an electron is caught in the vacancy (negative charge state, hereinafter referred to as "NV$^-$") than when an electron is not caught in the vacancy (neutral state, hereinafter referred to as "NV$^0$"). That is, NV$^-$ shows a long transverse relaxation time (decoherence time, hereinafter referred to as "$T_2$"). NV$^-$ shows a large $T_2$ value even at room temperature (about 300 K).

Since the electron spin state of NV$^-$ changes in response to the external magnetic field, and the electron spin state can be measured at room temperature a diamond containing NV centers can be used as a material for a magnetic sensor element.

Further, the electron spin state of NV$^-$ can be artificially manipulated (brought into a specific electron spin state) from outside by a method such as microwave irradiation. The manipulation can be performed at room temperature, and when consideration is also given to long $T_2$, the NV centers are expected to be usable as quantum bits which enable quantum states to be stably written and read. Therefore, a diamond containing NV centers can be used as a material for a quantum information element and an electronic circuit element.

Diamonds containing NV centers are also described in Nature Materials volume 8, pages 383-387 (2009), a literature by Gopalakrishnan Balasubramanian, Norikazu Mizuochi et al., "Ultralong spin coherence time in isotopically engineered diamond," which was published online at www.nature.com on Apr. 6, 2009. Hereinafter, the literature is referred to as "Reference 1."

Technical Problem

In conventional diamonds, NV centers are not stable in an NV$^-$ state. Particularly, in the vicinity of a surface, charge is unstable and there are many NV centers in an NV$^0$ state. Because of the unstable charge, the $T_2$ value at room temperature does not exceed a certain value, and $T_2$ is about 1.8 ms at most as shown in Reference 1. Thus, there is a limit on the performance of a sensor element including such a diamond.

SUMMARY OF THE INVENTION

An object of the present invention is to provide a sensor element composed only of a diamond in which NV centers stabilize in NV$^-$. Another object of the present invention is to provide a measurement device including the sensor element, a method for manufacturing a sensor element, an electronic circuit element composed only of a diamond, and a quantum information element composed only of a diamond.

Solution to Problem

For solving the above-described problems, a sensor element according to the present invention is composed only of a diamond which is n-type phosphorus-doped and contains one or more nitrogen-vacancy centers in a crystal structure.

In the diamond forming the sensor element according to the present invention, the ratio of $^{12}C$ in carbon atoms forming the crystal of the diamond is more than 99% and the concentration of phosphorus contained in the crystal of the diamond is preferably $1\times10^{15}$ cm$^{-3}$ or more and $1\times10^{18}$ cm$^{-3}$ or less.

In the diamond, the decoherence time $T_2$ of the nitrogen-vacancy centers is preferably more than 2.1 ms as measured in the condition of 300K by the Hahn Echo method, and corresponding $T_2^*$ is preferably more than 0.5 ms.

In the diamond, it is preferable that the nitrogen-vacancy centers each have a sensitivity of less than 3.1 nTHz$^{-1/2}$ to an alternate magnetic field and a sensitivity of less than 20 nTHz$^{-1/2}$ to a constant magnetic field.

The operation environment temperature of the sensor element of the present invention is preferably 10$^{-3}$ K or higher and 10$^3$ K or lower.

A measurement device for measuring at least one of a magnetic field, an electric field, a temperature and a dynamic quantity can be produced as a device including the sensor element of the present invention.

The measurement device can be at least one of a measurement device incorporated in medical equipment, a measurement device incorporated in an in-vehicle device and a measurement device incorporated in a life science device.

A method for manufacturing a sensor element according to the present invention includes manufacturing a diamond in an atmosphere containing a carbon compound, a phosphorus compound and nitrogen atoms, the diamond being n-type phosphorus-doped and containing one or more nitrogen-vacancy centers in a crystal structure, wherein the ratio of $^{12}C$ in carbon atoms forming the crystal of the diamond is more than 99% and the concentration of phosphorus contained in the crystal of the diamond is $1\times10^{15}$ cm$^{-3}$ or more and $1\times10^{18}$ cm$^{-3}$ or less, and the sensor element is composed only of the diamond.

Preferably, the manufacturing method includes growing a diamond film on a substrate by a chemical vapor deposition method.

An electronic circuit element of the present invention is composed only of a diamond which is n-type phosphorus-doped and contains one or more nitrogen-vacancy centers in a crystal structure, in which the ratio of $^{12}C$ in carbon atoms forming the crystal of the diamond is more than 99% and the concentration of phosphorus contained in the crystal of the diamond is $1\times10^{15}$ cm$^{-3}$ or more and $1\times10^{18}$ cm$^{-3}$ or less.

A quantum information element of the present invention is composed only of a diamond which is n-type phosphorus-doped and contains one or more nitrogen-vacancy centers in a crystal structure, in which the ratio of $^{12}$C in carbon atoms forming the crystal of the diamond is more than 99% and the concentration of phosphorus contained in the crystal of the diamond is $1\times10^{15}$ cm$^{-3}$ or more and $1\times10^{18}$ cm$^{-3}$ or less.

Advantageous Effects of Invention

In the n-type phosphorus-doped diamond forming the sensor element of the present invention, NV centers stabilize in an NV$^-$ state, and a decoherence time $T_2$ longer than ever before can be obtained. Use of the diamond allows the sensor element of the present invention to have superior performance over conventional sensor elements. The sensor element is suitably used for measurement devices. By using a similar diamond, excellent electronic circuit elements and quantum information elements can be obtained.

DETAILED DESCRIPTION OF THE INVENTION

An n-type phosphorus-doped diamond used in a sensor element as an example of an embodiment according to the present invention will be described. The diamond is a synthetic diamond manufactured through homoepitaxial growth of a diamond film on the (111) plane of an Ib type diamond crystal substrate containing monoatomic nitrogen.

In the embodiment, a synthetic diamond is manufactured by a method capable of manufacturing a diamond which is n-type phosphorus-doped and contains one or more NV centers in a crystal structure, and a phosphorus-doped n-type diamond is prepared in which the ratio of $^{12}$C in carbon atoms forming the crystal is more than 99% and the concentration of phosphorus is $1\times10^{15}$ cm$^{-3}$ or more and $1\times10^{18}$ cm$^{-3}$ or less.

Figure 1:
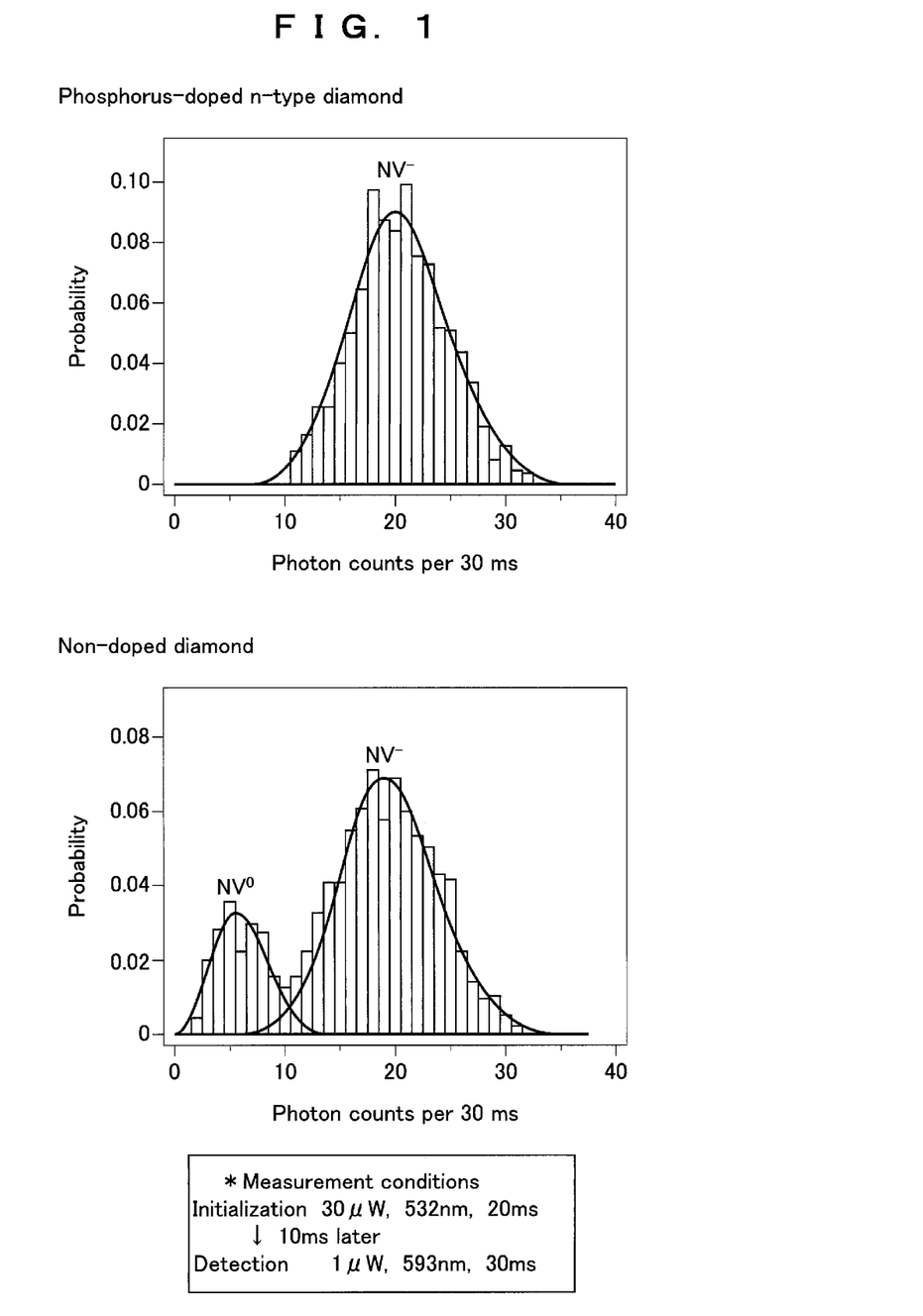
FIG. 1 shows graphs in which fluorescence dynamics at NV centers in a phosphorus-doped n-type diamond used in an example of an embodiment and a conventional (non-doped) diamond are expressed in the form of histograms, respectively, where the upper diagram is a graph for the phosphorus-doped n-type diamond, and the lower diagram is a graph for the non-doped diamond.

The NV centers contained in the n-type phosphorus-doped diamond more easily stabilize in an NV$^-$ state as compared to conventional diamonds. FIG. 1 shows histograms of fluorescence dynamics of NV centers in a phosphorus-doped n-type diamond and fluorescence dynamics of NV centers in a conventional (non-doped) synthetic diamond which has not been phosphorus-doped. It is apparent from the upper diagram in FIG. 1 that in the phosphorus-doped n-type diamond of the embodiment, there are little fluorescence dynamics derived from an NV$^0$ state, and the NV centers more easily stabilize in an NV$^-$ state as compared to the conventional synthetic diamond.

Further, in the diamond, since the NV centers easily stabilize in an NV$^-$ state, $T_2$, which has been heretofore about 1.8 ms at most, is longer than 2.1 ms, and the corresponding dephasing time is longer as compared to conventional diamonds, and exceeds 0.5 ms.

For the NV centers present in the crystal of the diamond, the single NV center exhibits a superior alternate magnetic field sensitivity over the single NV center of the conventional diamond in which the alternate magnetic field sensitivity is 4.3 nTHz$^{-1/2}$. The diamond exhibits excellent performance in the spatial resolution because the single NV center exhibits an excellent magnetic field sensitivity.

Since, as described above, the n-type phosphorus-doped diamond exhibits long $T_2$ at room temperature and has a very high sensitivity to a magnetic field per NV center and an excellent spatial resolution, the n-type phosphorus-doped diamond is excellent as a material for sensor elements.

Figure 2:
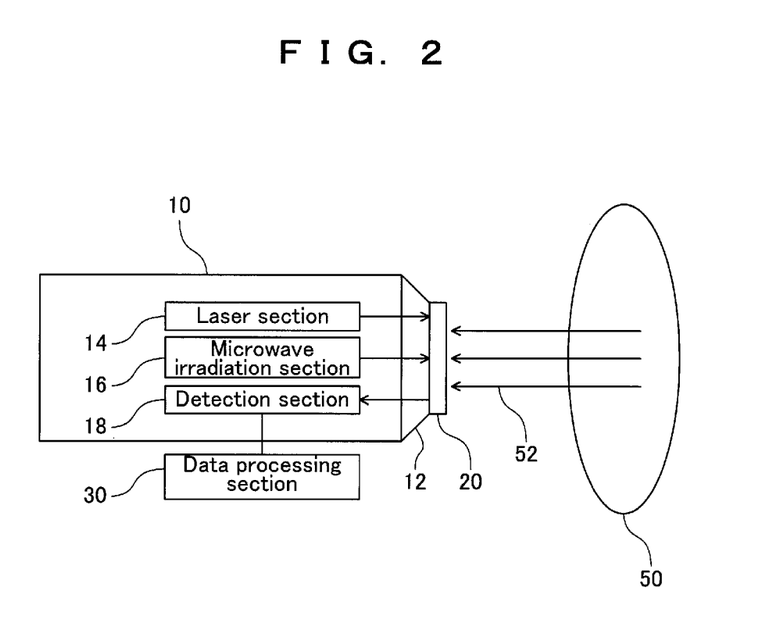
FIG. 2 is a schematic diagram showing an example of a measurement device including the sensor element of the embodiment.

FIG. 2 shows an example of a measurement device 10 including a sensor element 20 of the embodiment. Here, a device for measuring a magnetic field will be described as an example. Specifically, the measurement device may be a scanning probe microscope such as an atomic force microscope. The sensor element 20 of the embodiment is attached to the tip of a probe 12 of the measurement device 10. The sensor element 20 includes the phosphorus-doped n-type diamond, and may include, in addition to the diamond, a connection member for attachment to the probe 12.

The measurement device 10 is provided with a laser section 14 irradiating the sensor element 20 with laser light, a microwave irradiation section 16 irradiating the sensor element 20 with a microwave, and a detection section 18 detecting photons or electromagnetic waves emitted from the sensor element 20. The detection section 18 is connected to a data processing section 30. The data processing section 30 may be integrated with the measurement device 10 or may be an external device such as a computer which is provided outside the measurement device 10.

An alternate magnetic field 52 generated from a measurement target 50 can be measured with the measurement device 10. In the measurement, laser light emitted from the laser section 14 polarizes the NV centers of the diamond of the sensor element 20 to the ground state, and a microwave emitted from the microwave irradiation section 16 brings the NV centers into a specific electron spin state (state in which the ground state overlaps another level).

When the probe 12 approaches the measurement target 50, the electron spins of NV centers brought into a specific electron spin state through the aforementioned procedure interact with the alternate magnetic field 52 of the measurement target 50. When the interaction is performed for a sufficient time, the electron spin state of NV centers becomes a state corresponding to the intensity of the alternate magnetic field 52. The sensor element 20 is irradiated with laser light from the laser section 14, and the detection section 18 detects photons or electromagnetic waves emitted from the sensor element 20, whereby an electron spin state after the interaction is read.

The data processing section 30 receives the electron spin state detected by the detection section 18 after the interaction and processes the detected data. Since the electron spin state after the interaction corresponds to the specific electron spin state set by the microwave irradiation section 16 and the alternate magnetic field 52 of the measurement target 50, appropriate processing of the detected data by the data processing section 30 enables examination of what state of magnetic field the alternate magnetic field is. For example, the data processing section 30 can calculate the intensity of the alternate magnetic field 52 of the measurement target 50 by performing such as processing for determination of the probability that the electron spin state after the interaction becomes the ground state.

The measurement device 10 measures the alternate magnetic field 52 in the manner described above. Since the NV centers of the phosphorus-doped n-type diamond are stable at room temperature, this measurement can be performed at room temperature. In addition, since the NV centers are very stable, the sensor element 20 normally operates even when the environmental temperature is an extremely low temperature of $10^{-3}$ K or a high temperature of $10^3$ K. On the other hand, in the case of measurement at room temperature, a cooling mechanism which would be essential for conventional devices such as a superconducting quantum interference device (SQUID) is not required, and therefore the measurement device 10 can be made smaller in size.

While measurement of a magnetic field has been described above, the measurement device 10 can examine not only the magnetic field but various pieces of information about the measurement target because the electron spins of NV centers interact with the measurement target. Since the electron spin state of NV centers changes depending on various factors such as an electric field from the measurement target, a temperature of the measurement target, and dynamic quantities such as dynamic stress (pressure) on the measurement target, appropriate processing of data of the detected electron spin state after the interaction by the data processing section 30 enables examination of the electric field, the temperature, the dynamic quantities and the like of the measurement target.

A scanning probe microscope has been described above as a specific example of the measurement device, and at the time when an operator examines information about the measurement target using the sensor element of the present invention, it is not necessary to contact the probe with the measurement target directly and only interaction of quantum states is required. Thus, for example, medical workers can non-invasively examine a patient's condition in a medical institution. A measurement device including the sensor element of the present invention can be incorporated in medical equipment.

A measurement device for examining a microscopic state has been described above, and by taking advantage of being operable even in a high-temperature environment at $10^3$ K, a measurement device including the sensor element of the present invention can be incorporated in automobile in-vehicle equipment whose temperature may be very high when the vehicle is moving. For example, the sensor element of the present invention can be used in a device for detecting the remaining battery capacity in an electric vehicle. The sensor element of the present invention has a very excellent magnetic field sensitivity, and is therefore capable of examining the remaining battery capacity more accurately than conventional remaining battery capacity detecting devices. With a conventional remaining battery capacity detecting device, a remaining capacity below a certain level cannot be examined, and therefore it is determined that battery exhaustion occurs at the point of falling below a remaining capacity which can be accurately examined (for example, about 30% of full capacity). On the other hand, with a remaining capacity detecting device using the sensor element of the present invention, it can be determined that the battery may be operated even at a remaining capacity below the limit of detection for the conventional remaining capacity detecting device, and thus it is possible to more effectively use the battery power storage capacity.

In addition, the measurement device can be made smaller in size than ever before, and therefore can be incorporated in, for example, a headgear attached to the head of a human. In this case, the measurement device can be used as a magnetoencephalographic meter for examining brain waves emitted from the human brain. Because of the high sensitivity and high resolution, the measurement device can be used for analysis of the structures of molecules composed of one to several atoms and analysis of the structures of proteins. When a diamond in the form of nanoparticles is introduced in a living body, the measurement device is capable of tracking the life activity of the living body by examining the electron spins of NV centers in the nanoparticles. In this way, the phosphorus-doped n-type diamond can be used as a sensor element incorporated in a so-called life science device.

While use of the phosphorus-doped n-type diamond for a sensor element has been described above, an electronic circuit element including a phosphorus-doped n-type diamond can be prepared by taking advantage of the fact that the electron spin state of NV centers is responsive to an electromagnetic field.

By taking advantage of the fact that the coherence time $T_2$ of the electron spins of NV centers is very long, i.e. the quantum state stabilizes for a long time, the phosphorus-doped n-type diamond can be used in quantum information elements such as quantum memories for recording quantum states, and quantum relaying devices for copying a quantum state of a quantum device and transferring the quantum state to another quantum device in quantum communication.

EXAMPLE

A synthetic diamond according to Example of the present invention was manufactured using a chemical vapor deposition (CVD) method in an atmosphere containing as raw material gases a small amount of a phosphorus compound (here phosphine $PH_3$), and a carbon compound (here methane $CH_3$) in which the ratio of the carbon isotope $^{12}C$ exceeds the natural abundance ratio that is 98.89% (here 99.99%). The atmosphere contained a slight amount of air-derived hydrogen molecules $H_2$ and nitrogen molecules $N_2$ in addition to the raw material gases. As a result, nitrogen atoms in the atmosphere were taken in the crystal structure of the diamond manufactured, so that the crystal structure contained one or more nitrogen-vacancy (NV) centers.

Through the CVD method, an n-type phosphorus-doped synthetic diamond sample, in which the ratio of $^{12}C$ in carbon atoms forming the crystal was more than 99% and the concentration of phosphorus was $1 \times 10^{15}$ cm$^{-3}$ or more and $1 \times 10^{18}$ cm$^{-3}$ or less, was obtained as a diamond used in Example. While a plurality of kinds of samples were manufactured, a synthetic diamond sample having a $^{12}C$ ratio of 99.99% and a phosphorus concentration of $6 \times 10^{16}$ cm$^{-3}$ will be described as Example below.

Figure 3:
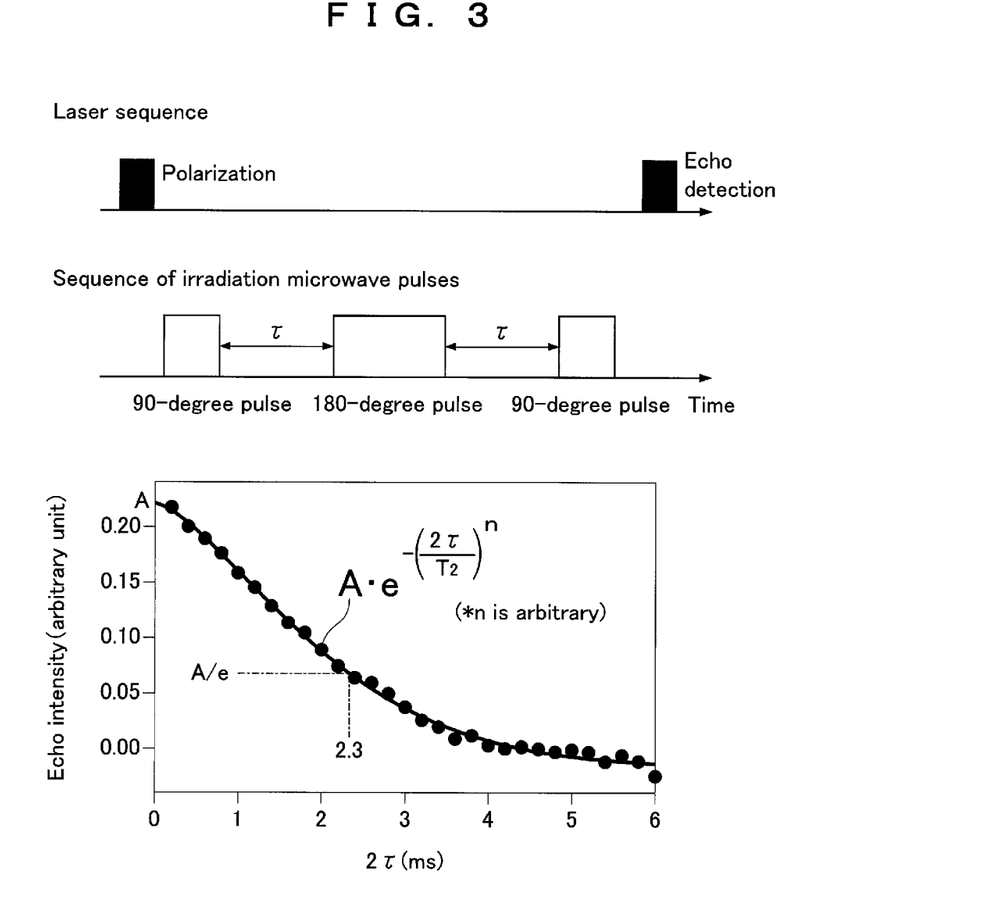
FIG. 3 is a graph showing the results of measuring the $T_2$ value of the phosphorus-doped n-type diamond used in the embodiment.

$T_2$ of the diamond was measured by the Hahn Echo method, and the result shown in FIG. 3 was obtained. As shown in FIG. 3, $T_2$ is 2.3±0.1 ms, and much higher than $T_2$ of the conventional diamond which is about 1.8 ms at most. Thus, the diamond of Example has a $T_2$ of more than 2.1 ms. The corresponding dephasing time $T_2^*$ was measured, and a value of 0.620±0.096 ms was obtained. This value exceeds 0.5 ms, and is much higher than $T_2^*$ of the conventional diamond which is 0.470±0.100 ms. The measurement could be perform at room temperature (about 300 K).

For the NV centers present in the crystal of the diamond, the level of the magnetic field sensitivity of the single NV center was examined, and a sensitivity of 3.0 nTHz$^{-1/2}$ or less was obtained. This sensitivity is better than the sensitivity of the conventional diamond which is 4.3 nTHz$^{-1/2}$. This sensitivity is a sensitivity to the alternate magnetic field, and for the constant magnetic field sensitivity, the diamond of Example showed a sensitivity of 16 nTHz$^{-1/2}$, which is better than the sensitivity of the conventional diamond which is 40 nTHz$^{-1/2}$.

Figure 4:
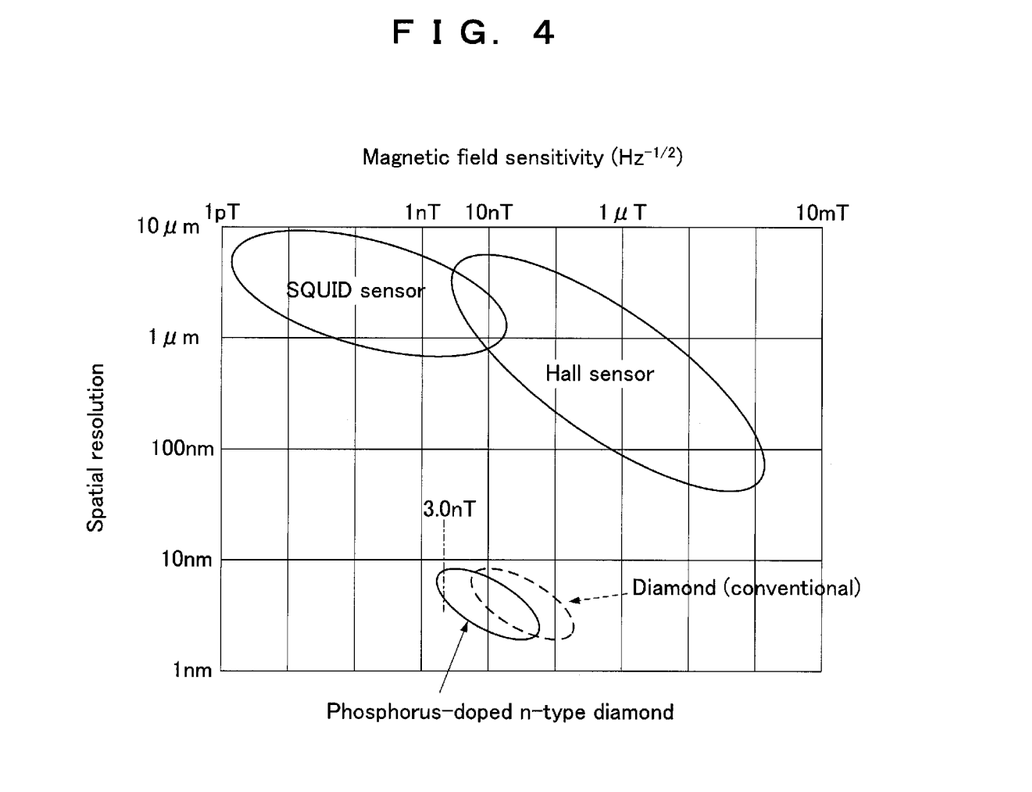
FIG. 4 is a graph showing the spatial resolution of the phosphorus-doped n-type diamond used in the embodiment in comparison with the spatial resolution of the conventional diamond and the spatial resolutions of the conventional field sensors.

The phosphorus-doped n-type diamond has such a magnetic field sensitivity with a single NV center, and therefore exhibits excellent performance in the spatial resolution. FIG. 4 shows the magnetic field sensitivity-associated spatial resolution of the phosphorus-doped n-type diamond of Example and the spatial resolutions of conventional magnetic field sensors. The dotted line represents the spatial resolution of the conventional diamond.

For conventional SQUID, the spatial resolution decreased because a thick heat-insulating layer was required for securing a low-temperature environment, and the resolution was about 1 μm at a magnetic field sensitivity of about 10 nTHz$^{-1/2}$. On the other hand, for the phosphorus-doped n-type diamond, a resolution of less than 10 nm was obtained at a magnetic field sensitivity of 10 nTHz$^{-1/2}$. Further, the resolution was obtained at room temperature (about 300 K). That is, the phosphorus-doped n-type diamond of Example exhibited an excellent spatial resolution without requiring an extremely low temperature (4 K or lower) achieved by cooling with liquid helium as in the case of SQUID.

In Example, a high magnetic field sensitivity (for an alternate magnetic field, 3.0 nTHz$^{-1/2}$ or less, i.e. less than 3.1 nTHz$^{-1/2}$, and for a constant magnetic field, less than 20 nTHz$^{-1/2}$ can be detected with a single NV center) and a high spatial resolution (10 nm or less at 10 nTHz$^{-1/2}$) were achieved by using a phosphorus-doped n-type diamond for the sensor element 20 of the measurement device 50.

The specific ratio of $^{12}C$ was 99.99% in the phosphorus-doped n-type diamond used in Example, but this ratio will do as long as higher than 99%, a value exceeding the natural ratio which is 98.89%. For example, good $T_2$ exceeding 1.8 ms was observed even when the ratio of $^{12}C$ was 99.7%.

The specific phosphorus concentration was $6 \times 10^{16}$ cm$^{-3}$ in the phosphorus-doped n-type diamond used in Example, but the phosphorus concentration effective as a diamond usable as an excellent sensor element varies to some extent, and a phosphorus concentration range of $1 \times 10^{15}$ cm$^{-3}$ or more and $1 \times 10^{18}$ cm$^{-3}$ or less is sufficient.

CVD was exemplified as a method for manufacturing a phosphorus-doped n-type diamond, but the phosphorus-doped n-type diamond may be manufactured by a method other than CVD as long as a diamond having a $^{12}C$ ratio of more than 99% and a phosphorus concentration of $1 \times 10^{15}$ cm$^{-3}$ or more and $1 \times 10^{18}$ cm$^{-3}$ or less can be manufactured with stability.

REFERENCE SIGNS LIST

10 Measurement device
14 Laser section
16 Microwave irradiation section
18 Detection section
20 Sensor element
30 Data processing section
50 Measurement target

What is claimed is:

1. A sensor element comprising a diamond which is n-type phosphorus-doped and contains one or more nitrogen-vacancy center in a crystal structure, wherein a crystal of the diamond meets both of the following conditions (A) and (B):
   (A) a ratio of $^{12}C$ in carbon atoms forming the crystal of the diamond is more than 99.7%, and
   (B) a concentration of phosphorus contained in the crystal of the diamond is $6 \times 10^{16}$ cm$^{-3}$ or more and $1 \times 10^{18}$ cm$^{-3}$ or less,
   wherein each one of said one or more nitrogen-vacancy center contained in the diamond has a sensitivity of less than 3.1 nTHz$^{-1/2}$ to an alternate magnetic field and a sensitivity of less than 20 nTHz-½ to a constant magnetic field.

2. The sensor element according to claim 1, wherein a decoherence time $T_2$ of the nitrogen-vacancy centers contained in the diamond is more than 2.1 ms as measured in a condition of 300 K by a Hahn Echo method, and a corresponding $T_2^*$ is more than 0.5 ms.

3. The sensor element according to claim 1, wherein an operation environment temperature is $10^{-3}$ K or higher and $10^3$ K or lower.

4. A measurement device comprising the sensor element according to claim 1 and for measuring at least one of
   a magnetic field,
   an electric field,
   a temperature, and
   a dynamic quantity.

5. The measurement device according to claim 4, wherein the measurement device is at least one of
   a measurement device incorporated in medical equipment,
   a measurement device incorporated in an in-vehicle device, and
   a measurement device incorporated in a life science device.

6. A method for manufacturing a sensor element, comprising manufacturing a diamond in an atmosphere containing
   (i) a carbon compound in which carbon isotope $^{12}C$ exceeds the natural abundance ratio of 98.89%,
   (ii) a phosphorus compound, and
   (iii) nitrogen atoms,
   the diamond being n-type phosphorus-doped and containing one or more nitrogen-vacancy center in a crystal structure, wherein a crystal of the diamond meets both of the following conditions (A) and (B):
   (A) a ratio of $^{12}C$ in carbon atoms forming the crystal of the diamond is more than 99.7%, and
   (B) a concentration of phosphorus contained in the crystal of the diamond is $6 \times 10^{16}$ cm$^{-3}$ or more and $1 \times 10^{18}$ cm$^{-3}$ or less, and
   wherein the sensor element is comprised of the diamond, and
   wherein each one of said one or more nitrogen-vacancy center contained in the diamond has a sensitivity of less than 3.1 nTHz$^{-1/2}$ to an alternate magnetic field and a sensitivity of less than 20 nTHz$^{-1/2}$ to a constant magnetic field.

7. The method for manufacturing a sensor element according to claim 6, comprising growing a diamond film on a substrate by a chemical vapor deposition method in the manufacturing a diamond.

8. An electronic circuit element comprised of a diamond which is n-type phosphorus-doped and contains one or more nitrogen-vacancy centers in a crystal structure, wherein a crystal of the diamond meets both of the following conditions (A) and (B):

(A) a ratio of $^{12}$C in carbon atoms forming the crystal of the diamond is more than 99.7%, and (B) a concentration of phosphorus contained in the crystal of the diamond is $6 \times 10^{16}$ cm$^{-3}$ or more and $1 \times 10^{18}$ cm$^{-3}$ or less.

9. A quantum information element comprised of a diamond which is n-type phosphorus-doped and contains one or more nitrogen-vacancy center in a crystal structure, wherein a crystal of the diamond meets both of the following conditions (A) and (B):

(A) a ratio of $^{12}$C in carbon atoms forming the crystal of the diamond is more than 99.7%, and (B) a concentration of phosphorus contained in the crystal of the diamond is $6 \times 10^{16}$ cm$^{-3}$ or more and $1 \times 10^{18}$ cm$^{-3}$ or less, wherein each one of said one or more nitrogen-vacancy center contained in the diamond has a sensitivity of less than 3.1 nTHz$^{-1/2}$ to an alternate magnetic field and a sensitivity of less than 20 nTHz$^{-1/2}$ to a constant magnetic field.

10. The method for manufacturing a sensor element according to claim 6, wherein a decoherence time $T_2$ of the nitrogen-vacancy centers contained in the diamond is more than 2.1 ms as measured in a condition of 300 K by a Hahn Echo method, and a corresponding $T_2^*$ is more than 0.5 ms.

11. The method for manufacturing a sensor element according to claim 6, wherein spatial resolution provided by the diamond at 300K is 10 nm or less at a magnetic field density of 10 nTHz$^{-1/2}$.

* * * * *